United States Patent [19]

Doemens et al.

[11] Patent Number: 4,814,626

[45] Date of Patent: Mar. 21, 1989

[54] METHOD FOR HIGH PRECISION POSITION MEASUREMENT OF TWO-DIMENSIONAL STRUCTURES

[75] Inventors: Guenter Doemens, Holzkirchen; Herbert Eigenstetter, Planegg; Peter Mengel, Eichenau, all of Fed. Rep. of Germany

[73] Assignee: Siemens Aktiengesellschaft, Berlin and Munich, Fed. Rep. of Germany

[21] Appl. No.: 934,335

[22] Filed: Nov. 24, 1986

[30] Foreign Application Priority Data

Dec. 13, 1985 [DE] Fed. Rep. of Germany ....... 3544224

[51] Int. Cl.$^4$ .............................................. G01B 11/00
[52] U.S. Cl. .................................... 250/561; 250/548; 250/566; 356/375; 356/401
[58] Field of Search ........... 250/548, 557, 561, 237 R, 250/566, 568; 356/399–401, 375; 364/559, 490–491; 358/107

[56] References Cited

U.S. PATENT DOCUMENTS

| | | | |
|---|---|---|---|
| 4,193,687 | 3/1980 | Reekstin et al. | 356/401 |
| 4,592,648 | 6/1986 | Tabarelli et al. | 250/548 |
| 4,687,980 | 8/1987 | Phillips et al. | 250/548 |

OTHER PUBLICATIONS

"Metrology in Mask Manufacturing", IBM J. Res. Develop, vol. 26, No. 5, Sep. 1982.

Primary Examiner—Edward P. Westin

[57] ABSTRACT

A method for high precision position measurement of two-dimensional structures such as structures on semiconductor wafers or masks, utilizing a reference mask having a two-dimensional grid, the relative position of the structures relative to the grid being identified by opto-electronic scanning using an image sensor and subsequent image processing. The absolute position of the structures to be measured can then be identified from the position of the grid elements. A reference mask is preferably employed whose grid elements carry a binary coding which can be read and decoded by the image processing means. The coding thereby indicates the position of the grid elements in the grid.

7 Claims, 5 Drawing Sheets

METHOD FOR HIGH PRECISION POSITION MEASUREMENT OF TWO-DIMENSIONAL STRUCTURES

BACKGROUND OF THE INVENTION

1. Field of the Invention

The present invention relates to a method of high precision position measurement of two-dimensional structures such as measuring structures on wafers or masks, and also relates to a reference mask for use in connection with the method.

2. Description of the Prior Art

In the manufacture of integrated semiconductor circuits, the build-up of the components and structures proceeds from one surface of a semiconductor wafer composed of a silicon crystal and referred to as the wafer. The silicon crystal serves both as a carrier for the overall circuit as well as the semiconductor material for the active components such as transistors and the like. The different dopings required in the semiconductor are generated from the surface of the semiconductor wafer either by means of diffusion technology or by means of ion implantation technology. Usually, a plurality of doping steps is sequentially necessary in various structures. The connecting and terminal lines are then produced, being laid on oxide layers provided with windows, and usually being laid one above the other at a plurality of structure levels. The transfer of the successively manufactured structures onto the semiconductor wafer occurs by means of a photolithographic process, in which the semiconductor wafer is coated with a photo-resist at every structuring stage and this photo-resist is then exposed through a mask having the corresponding desired structure and is then developed. With increasingly smaller structured dimensions and increasingly larger wafers, the congruence or coincidence of the structures to be successively generated on the wafer in various photo-technique levels becomes increasingly important. The causes of registration errors of the structures to be successively transferred by photolithography onto the semiconductor wafer occur in the adjustment of successive masks relative to the wafer as well as in the scattering of the positions of the individual structure elements in the wafer and in the mask. Such scattering can be attributed to systematic errors of the exposure apparatus employed, to a warping of the wafer or mask in the progress of the chemical processes, or other causes which lead to a warping of the mask or wafer.

German Pat. No. 2 822 269 discloses a method for automatic mask adjustment wherein the adjustment of successive masks is undertaken with adjustment structures proceeding orthogonally relative to one another on the wafer coated with a photo-resist and on the mask. The adjustment structure of the wafer is produced in the first structuring process on the surface of the wafer, for example, by etching, so that the adjustment structures present on the corresponding mask in all following structuring processes can be aligned relative to this first adjustment structure. For automatic mask adjustment, the adjustment structures on mask and wafer are then opto-electronically scanned in directions parallel to their edges with the aid of an image sensor so that the intensity of the picture signal generated by the opto-electronic scanning is integrated on a line-by-line basis or in line sections and the analog integral values resulting are converted into digital gray scales and are stored. By forming the difference of the gray scales of successive lines and further evaluation of the resulting different signals, the position of the center axes of the adjustment structures can then be determined. Then, wafer and mask are displaced relative to one another for adjustment in accordance with the identified offset of the center line.

In view of the problem of scattering the positions of the individual structure elements in the wafer or in the mask, absolute position measurements were heretofore performed by means of specific measuring instruments. The subject edges were photo-electrically determined and the spacing was identified by means of laser interferometers by moving the mask or the wafer. This arrangement requires ultra-high precision of the mechanics, a low degree of vibration, and a temperature stable environment as well as a regular calibration of the laser interferometers by corresponding norms. Overall, the installation of such a measuring possibility requires high capital costs, and the measuring reliability obtained over the long run is determined by the quality of the regular calibration.

The article "Metrology in Mask Manufacturing" in IBM J. Res. Develop., Vol. 26, No. 5, September 1982, pages 553 to 560, discloses a method for the identification of registration errors on the structures on the wafer and mask with which the position measurement is undertaken with the use of quadratic measuring structures on the mask and wafer. These quadratic measuring structures are of different sizes on the mask and on the wafer so that the center deviations in squares nested in one another indicate topical registration errors. Absolute position measurements of two-dimensional structures on the mask or wafer, however, are not possible with this method.

SUMMARY OF THE INVENTION

The present invention provides a method for high precision position measurement of two-dimensional structures, particularly for measuring structures on wafers or masks, wherein the quality of the measurements is improved, the apparatus outlay is noticeably reduced, and the measuring procedure is made more straightforward.

In keeping with the present invention, there is provided a method for the high precision positional measurement of two-dimensional structures which includes positioning a reference mask over the structures, the reference mask comprising a transparent carrier and a two-dimensional grid disposed thereon, opto-electronically scanning the relative position of the structures to be measured relative to adjacent elements of the grid by means of an image sensor and a subsequent image processor, and determining the absolute position of the structures from the relative position measured by the scanning with respect to the predetermined position of elements of the grid.

The invention is based on the discovery that the problem of measuring minute structures having structure dimensions of, for example, 0.1 micron over relatively long paths, for example, of 100 microns can be resolved by direct comparative measurements relative to a standard, this standard being composed of a two-dimensional grid. For this purpose, a reference mask is arranged over the structures to be measured, the two-dimensional grid being situated on the transparent carrier of the reference mask. The relative position of the structures to be measured with respect to adjacent grid elements of the two-dimensional grid is then identified by opto-electronic scanning by means of an image sensor and subsequent image processing. The image processing apparatus known, for example, from German Pat. No. 2 822 269 can be utilized for this purpose. The absolute position of the structures to be measured relative to the two-dimensional grid is then identified from the measured relative position relative to neighboring grid elements and from the predetermined position of these grid elements in the two-dimensional grid. The problematical, long paths are thus not directly identified but are identified by the known dimensions of the grid structure.

The significant advantages of the method of the invention are, specifically, only a slight systematic measuring uncertainty, a high reliability due to a greater degree of independence of temperature fluctuations, vibrations, as well as calibrations, the elimination of mechanically moving parts and a simple and economical structure of the necessary measuring setup.

In a preferred embodiment of the present invention, the two-dimensional grid and the structures to be measured are each imaged in sharp focus on the image sensor by adjusting the objective lens of a microscope. By using the unequivocally sharp imaging of the respective structures on the image sensor, the precision obtainable at the position measurement is further increased. A means for optical imaging of two subjects arranged in different subject planes which is suitable for this purpose is set forth in earlier European Patent Application No. 85 115 482.3.

The predetermined position of the grid elements in the two-dimensional grid is preferably identified by a coding of the individual grid elements which is automatically read and decoded by the image processing device. As a result of this coding, a counting of the individual grid elements or a measurement of the grid on the basis of rougher measuring methods can be eliminated so that the unequivocal positional specification of the individual grid elements further enhances the measuring reliability.

One of the features of the present invention provides that measuring structures are applied to the wafers or masks to be measured, composed of elements which are mutually offset by half a grid period and exhibit the same repetitive grid period as the two-dimensional grid. As a result thereof, a positional recognition of the measuring structures is prevented from being disturbed by the grid structure.

The present method preferably employs a reference mask wherein a two-dimensional grid is applied to a transparent carrier and the position of the individual grid elements in the grid is identifiable by a coding applied thereto. Binary codings which can be read in an easy way by known image processing devices are preferably applied to the grid elements.

In a further preferred development of the present invention, the reference mask includes binary coding which is formed by rhomboids whose diagonals extend parallel to the edges of the grid elements. The edges of the rhomboids thus do not extend parallel to the edges of the grid elements so that there is no disturbing influence of the coding on the position recognition of the edges of the grid elements which is to be carried out with high precision.

An increase in the measuring precision obtainable occurs when the carrier is composed of a glassy ceramic. Such a carrier for the reference mask is characterized by an especially low thermal coefficient of expansion. It is also advantageous to have the two-dimensional grid formed by a chromium layer applied to the carrier.

An example of the invention is shown in the drawings and will be set forth in greater detail below.

DESCRIPTION OF THE PREFERRED EMBODIMENTS

Figure 1:
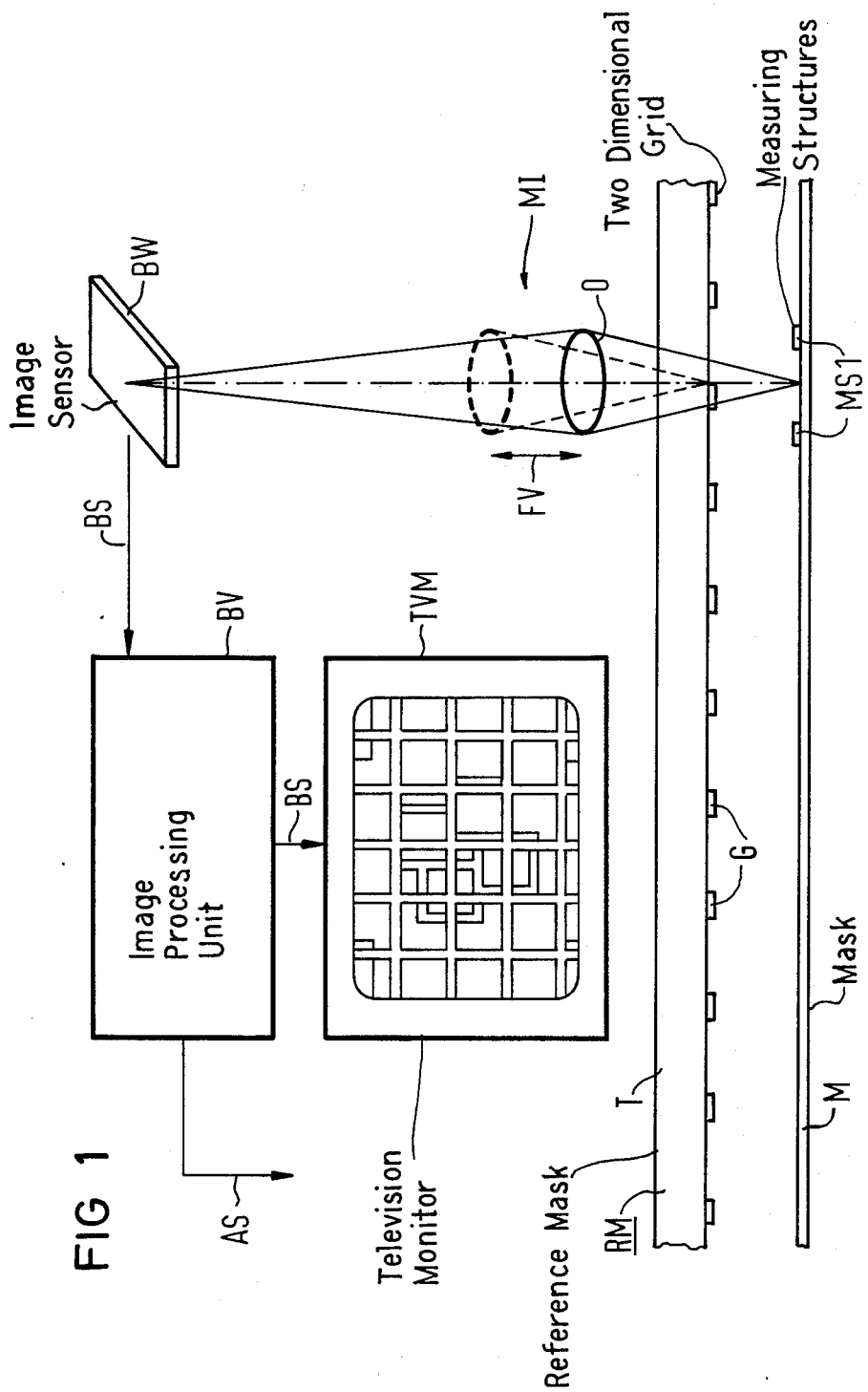
FIG. 1 illustrates a greatly simplified, schematic illustration of an arrangement for high precision position measurement of measuring structures on wafers or masks.

In FIG. 1, there is shown an arrangement for high precision position measurement of measuring structures MS1 which are located on a mask M next to the structure to be transferred onto a wafer. A reference mask identified as RM overall is composed of a carrier T and a two-dimensional grid G applied thereto and situated above the mask at a slight distance, for example, of 20 microns. A glassy ceramic having a low coefficient of thermal expansion serves as a carrier T and the two-dimensional grid G consists of a thin layer of chromium.

The edges of the measuring structures MS1 and the edges of the two-dimensional grid G are opto-electronically scanned by means of an image sensor BW, the image sensor BW comprising a CCD camera having 403×512 picture elements. A microscope MI is provided for imaging of the measuring structures MS1 and of the two-dimensional grid G on an image sensor BW, the objective lens O of the microscope MI being sharply focused on the respective structure level by an automatic focusing system. The corresponding focus adjustment is indicated by an arrow FV. A microscope suitable for this purpose whose objective is entirely shift-free relative to the various subject planes and which can be adjusted with an extremely high positioning reproducibility is disclosed in earlier European Patent Application No. 85 115 482.3.

The picture signal indicated at BS generated by the image sensor BW is supplied to an image processing device BV and to a TV monitor TVM on whose picture screen a measuring structure MS1 and a region of the two-dimensional grid G can be seen. The output signal referred to as AS of the image processing unit BV supplies potentially existing positional deviations of the measuring structures at corresponding locations of mask M.

The measuring structure MS1 on the mask M and the structures of the two-dimensional grid G on the reference mask RM are scanned by means of the image sensor BW in two directions extending perpendicular to each other and parallel to their edges. The intensity of the picture signals BS generated by the opto-electronic scanning is integrated line-by-line or in line sections in the image processing until BV and the analog integrals values resulting therefrom are converted into digital gray scales and stores. By forming the difference of the gray scales of successive lines and further evaluation of the resulting difference signals, the position of the individual structures can then be determined and the relative position of the respective measuring structures MS1 relative to the grid G can be automatically identified. Further details concerning such a gray scale image processing with line-by-line integration and subsequent symmetry observation are shown, for example, in German Pat. No. 28 22 269.

Figure 2:
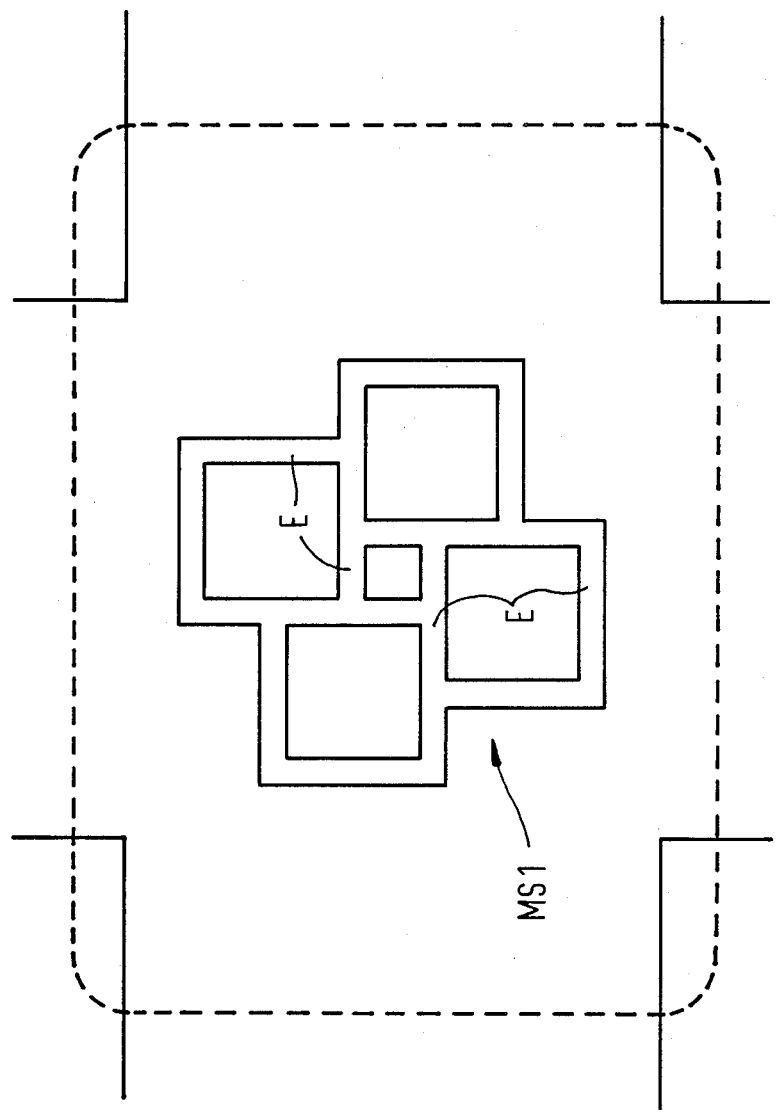
FIG. 2 illustrates a measuring structure on a mask produced with the arrangement of FIG. 1.

FIG. 2 illustrates a plan view of the measuring structure MS1. It will be seen that the individual elements E of the measuring structure MS1 are arranged offset in both directions relative to one another so that a coincidence with the grid period of the grid G as shown in FIG. 1 will not occur. It is therefore specifically preferred that the elements E be offset by one-half a grid period and exhibit the same period of repetition as the two-dimensional grid G.

Figure 3:
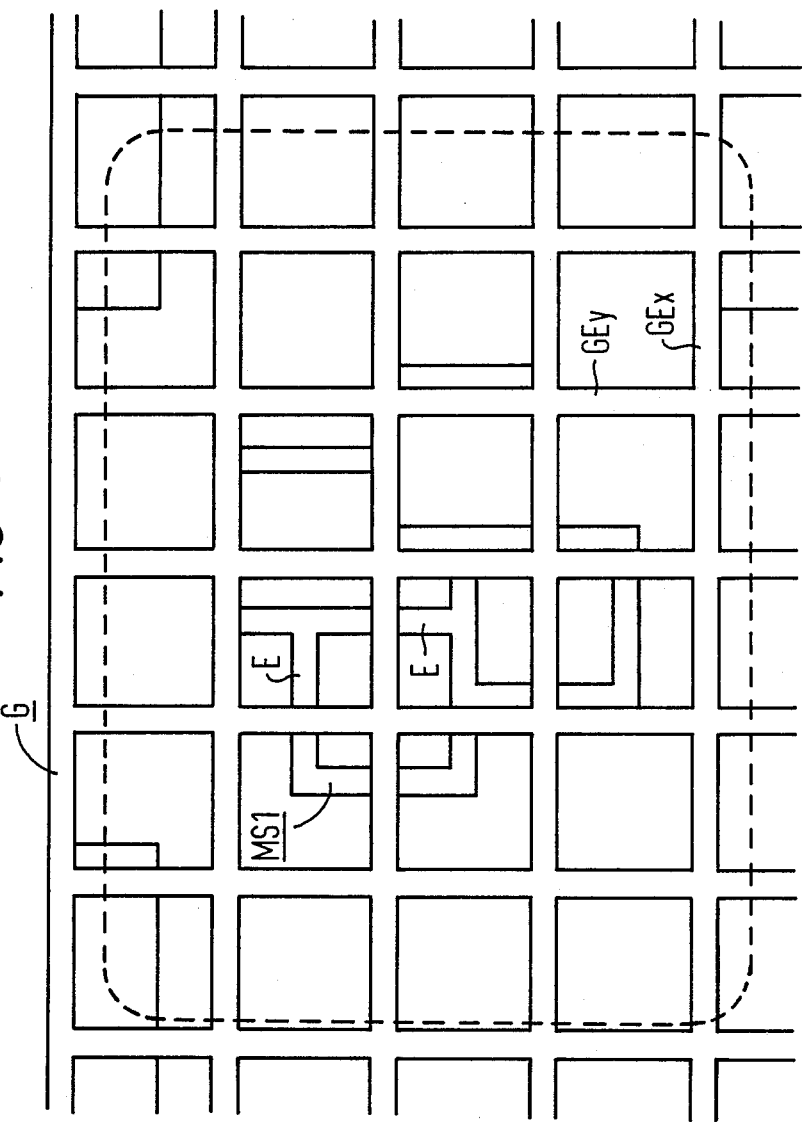
FIG. 3 illustrates the measuring structure shown in FIG. 2 with reference to a two-dimensional grid of a reference mask.

FIG. 3 illustrates the measuring structure MS1 shown in FIG. 2 together with the two-dimensional grid G. It may be seen that the elements E of the measuring structure MS1 and the grid elements GEx and GEy of the grid G can be opto-electronically scanned and can have their positions automatically determined without mutually disturbing one another or impeding one another. The relative position between a measuring structure MS1 and the neighboring grid elements GEx and GEy of the grid G can thus also be identified without problem.

Figure 4:
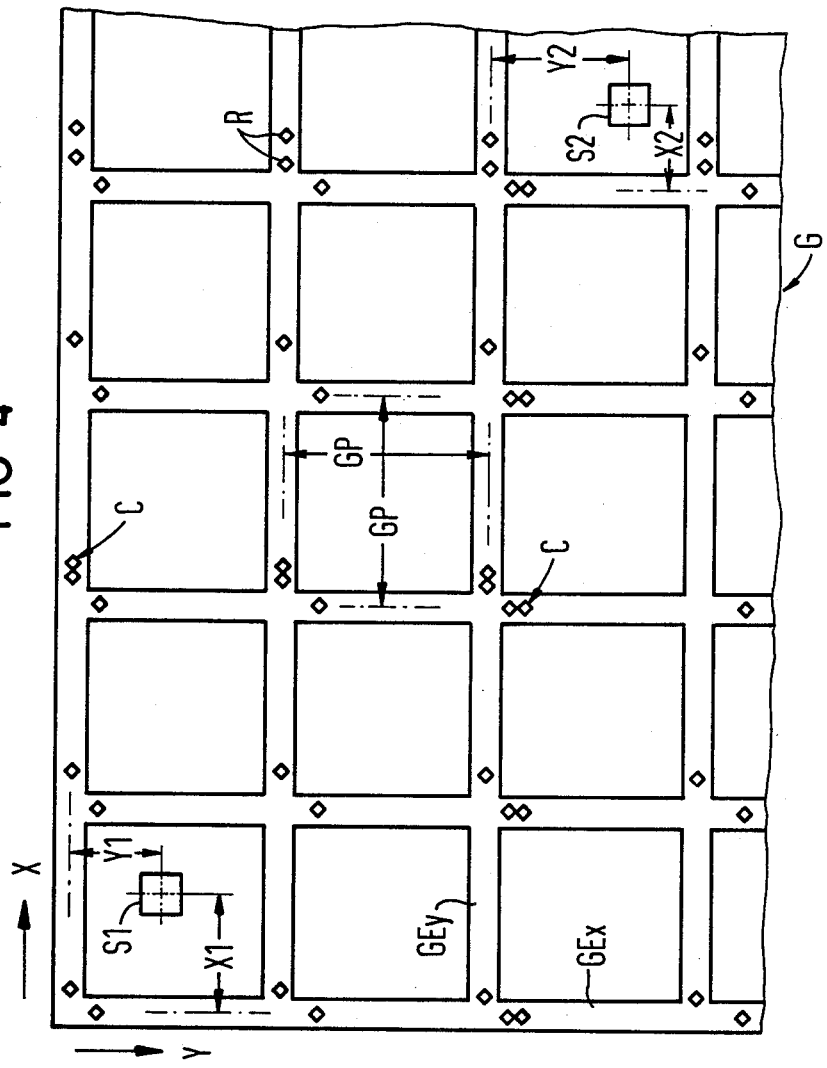
FIG. 4 illustrates a reference mask whose grid elements are provided with a coding.

FIG. 4 illustrates the principle of the position measurement of two-dimensional structures with the assistance of the grid G of the reference mask RM as shown in FIG. 1. Instead of the measuring structure MS1 shown in FIG. 2, two structures S1 and S2 arranged at a distance relative to each other are shown, being merely shown as squares in order to simplify the illustration. The grid elements GEx and GEy of the grid G extend parallel to the axis of an X, Y-coordinate system.

By means of opto-electronic scanning and subsequent image processing, the distances X1 and Y1 of the center line of the structure S1 from the center line of the grid element GEx lying to the left or of the grid element GEy lying above are first determined. In the same way, the distances X2 and Y2 of the center line of the structure S2 from the center line of the grid element GEx lying to the left thereof or of the grid element GEy lying thereabove are then identified. When the distances of the center points of the structures S1 and S2 are denoted $\Delta X$ in the X-direction and $\Delta Y$ in the Y-direction, then $$\Delta X = X2 - X1 + 4GP$$

$$\Delta Y = Y2 - Y1 + 2GP.$$

These equations apply for the case illustrated in FIG. 4 wherein GP is the grid period of the quadratic grid G in the X-direction and in the Y-direction.

In reality, the grid G shown in FIG. 4 comprises, for example:

$$2^{12} \times 2^{12} = 16,777,216$$

quadratic cells, so that instead of 4GP or 2GP, an extremely large number of grid periods GP is to be taken into consideration in practice. The identification of the plurality of grid periods GP to be taken into consideration can be undertaken in a simple way by opto-electronic scanning and subsequent image processing in the image processing unit BV shown in FIG. 1 with each grid element GEx and GEy being provided with a binary coding C which indicates its position in the grid G.

Figure 5:
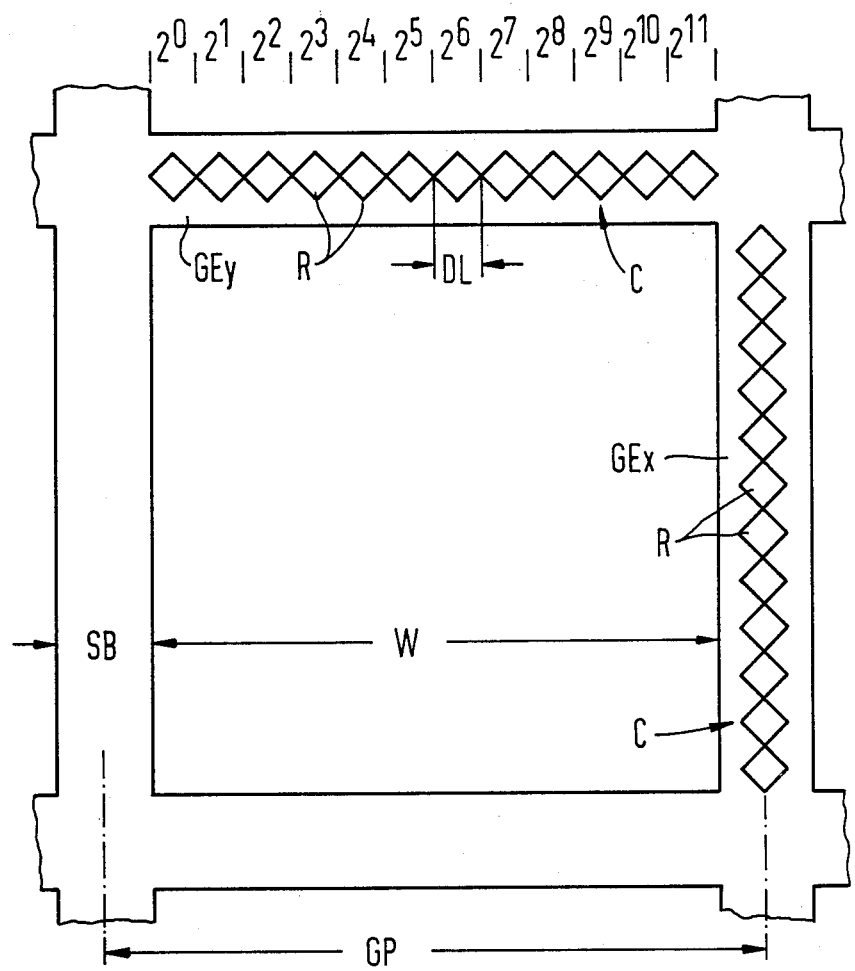
FIG. 5 illustrates details of the reference mask shown in FIG. 4.

FIG. 5 should be additionally referred to for further explanation of the coding C. Each grid element GEx and GEy can be identified by the codings C, the codings C being formed as rhomboids R. In accordance with FIG. 5, there is space for a total of 12 rhomboids R on every grid element GEx or GEy. The diagonals (not shown) of these rhomboids proceed parallel to the edges of the grid elements GEx and GEy. The existing rhomboids R are optically transparent so that they can be read and decoded by the opto-electronic scanning and the following image processing unit BV shown in FIG. 1. Dependent on its position, each rhomboid R indicates one of the values of powers of two between $2^0$ and $2^{11}$.

With the grid cell shown in FIG. 4 in which structure S1 lies, the codings C in both directions yield two $2^0 = 1$, i.e., the cell carries the number 1,1. In the grid cell in which the structure S2 lies, the codings C in the X-direction are $2^0 + 2^2 = 5$ and, in the Y-direction, $2^0 + 2^1 = 3$, so that the cell carries the number 5,3. In accordance with the difference of cell numbers, the values (5-1) GP or (3-1) GP are then taken into consideration in the above specified identified of $\Delta X$ and $\Delta Y$.

With the grid cell shown in FIG. 5, the clearance W of the grid cell, the web width SB of a grid element GEx or GEy and the diagonal length DL of a rhomboid R are also entered in addition to the grid period GP.

The following dimensions were utilized in the examplary embodiment:

GP = 28 microns
W = 24 microns
SB = 4 microns
DL = 2 microns

The method of the present invention has the advantage that high precision measurements of structures in the sub-micron range are possible over relatively long path lengths of, for example, 100 microns. This can be attributed to the fact that the high precision measurements are performed only in the near region of the structures and the remaining path lengths likewise are obtained very precisely from the coding of the grid.

It will be understood that various modifications can be made to the described embodiments without departing from the scope of the present invention.

We claim as our invention:

1. A method for the high-precision positional measurement of two-dimensional structures which comprises: positioning a reference mask over said structures, said reference mask comprising a transparent carrier and a two-dimensional grid of parallel lines disposed thereon, opto-electronically scanning the relative position of the structures to be measured relative to adjacent parallel lines of said grid by means of an image sensor and subsequent image processing means, said two-dimensional grid and said structures to be measured being sharply focused on said image sensor microscopically through an objective lens, and determining the absolute position of said structures from the relative position measured by said scanning with respect to the predetermined position lines of said grid, and wherein said predetermined position is identified by means of a coding of the individual grid lines, said coding being readable and decodable by said image processing means.

2. A method according to claim 1 wherein the structures to be measured have measuring structures thereon composed of elements which are mutually offset by one-half of a grid period and have the same period as the individual parallel lines of said two-dimensional grid.

3. Apparatus for high-precision positional measurements of two-dimensional structures which are to be measured comprising:
 a transparent carrier,
 a two-dimensional grid of orthogonal parallel lines on said carrier,
 codable indicia formed on said transparent carrier between said orthogonal parallel lines so as to encode the positions of said lines,
 a mask with said structures which are to be measured mounted adjacent said transparent carrier,
 a microscope mounted so as to receive an image from said mask through said transparent carrier,
 an image sensor mounted to receive said image from said microscope,
 an imaging processing unit connected to received the output of said image sensor, and
 a television monitor connected to receive an output of said image processing unit to produce display images and said image processing unit utilizing the output of said image sensor so as to decode positions of said lines on said carrier so as to determine the position of said structures which are to be measured.

4. Apparatus according to claim 3 wherein said coding is a binary coding.

5. Apparatus according to claim 4 wherein said binary coding includes rhomboids whose diagonals are parallel to the edges of said grid lines.

6. Apparatus according to claim 3 wherein said carrier is composed of a glassy ceramic.

7. Apparatus according to claim 3 wherein said two-dimensional grid is composed of a chromium layer applied to said carrier.

* * * * *